United States Patent [19] [11] Patent Number: 4,782,489
Moulsley [45] Date of Patent: Nov. 1, 1988

[54] METHOD FOR DECODING BINARY CODE WORDS USING ESTIMATED VALUES

[75] Inventor: Timothy J. Moulsley, Redhill, England

[73] Assignee: U.S. Philips Corporation, New York, N.Y.

[21] Appl. No.: 924,645

[22] Filed: Oct. 29, 1986

[30] Foreign Application Priority Data

Oct. 30, 1985 [GB] United Kingdom ............... 8526731

[51] Int. Cl.⁴ ............................................. G06F 11/10
[52] U.S. Cl. ........................................ 371/30; 371/33; 371/37
[58] Field of Search ............... 371/37, 38, 39, 30

[56] References Cited

U.S. PATENT DOCUMENTS

| 4,003,020 | 1/1977 | Clarke | 371/37 |
| 4,074,228 | 2/1978 | Jonscher | 371/33 |
| 4,340,963 | 7/1982 | Munday | 371/37 |
| 4,653,053 | 3/1987 | Pelchat | 371/37 |

FOREIGN PATENT DOCUMENTS 0116975 8/1984 European Pat. Off. .
0127984 12/1984 European Pat. Off. .
2073517 10/1981 United Kingdom .
2095517 9/1982 United Kingdom .

OTHER PUBLICATIONS

Redinbo, The Optimum Mean Square Decoding of General Block Codes, Information and Control, vol. 31, pp. 341–363.
Atel, Predictive Coding of Speech at Low Bit Rates, IEEE Transactions on Communication, vol. COM-30, No. 4, 4/82 pp.-600-614.

Primary Examiner—Michael R. Fleming
Attorney, Agent, or Firm—Thomas A. Briody; Jack E. Haken; Anne E. Barschall

[57] ABSTRACT

When communicating analogue signals over a data link an analogue signal is digitized at a transmitter into code words which are transmitted. This sequence is reversed at a receiver. At the receiver an estimate is made of the analogue signal value corresponding to each received code word taking into account the conditional probabilities that particular code words were transmitted for the particular received code word. These probabilities are calculated taking into account at least one prevailing condition such as recent history, soft decision information and channel state.

10 Claims, 2 Drawing Sheets

METHOD FOR DECODING BINARY CODE WORDS USING ESTIMATED VALUES

BACKGROUND OF THE INVENTION

1. Field of the Invention

The present invention relates to a method of decoding a succession of binary code words $y_j(t)$ received from a transmission channel, which code words result from the transmission over the channel of successive binary code words $x_j(t)$ representative of respective successive values $u_j(t)$ of an analogue signal, where $x_j(t) = F(u_j(t))$, in which method successive values $v_j(t)$ are generated which are estimated from the succesive received code words $y_j(t)$ to correspond to the successive $u_j(t)$, the estimation process taking the form $$v_j(t) \approx \frac{\sum_{i=1}^{n} p(x_i|y_j(t)) F^{-1}(x_i)}{\sum_{i=1}^{n} p(x_i|y_j(t))}$$

where $F^{-1}$ denotes the inverse of mapping function $F$, $n$ is an integer, and each $p(x_i|y_j(t))$ is an estimate of the relative conditional probability that $x_i$ was transmitted, $y_j(t)$ having been received.

2. Prior Art

The transmission of analogue signals via digital channels generally requires the conversion of the analogue signal to a sampled digital representative, encoding, transmission over the data link, reception, decoding and reconstruction of the original signal. If error protection is required then it is not unusual for redundant data to be added to enable error correction to to be effected at the receiver. This applies to, for example, pulse code modulation (PCM) transmission of speech and also to speech coding such as parametric coding using vocoders.

In a vocoder the parameters can themselves be viewed as sampled quantized analogue waveforms which require only moderate transmission accuracy to enable reproduction of the original speech signal, hence the small numbers of bits required compared with conventional PCM. However it will be realised that errors in some of the bits, for example the most significant bits (MSB) will produce much greater subjective effects than errors in bits of lower significance. Conventional error correction codes for data transmission have equal error correcting power for any data bit, which may be a wasteful use of resources when the errors occur in bits of low significance. A way of improving matters in this respect is discussed in an article by G. Robert Redinbo entitled "The Optimum Mean-Square Decoding of General Block Codes" in Information and Control, Vol. 31 pages 341-363 (1976) which discusses a method as defined in the first paragraph. However, the result of the known decoding method is still liable to result in errors and it is an object of the present invention to enable these errors to be reduced.

According to the invention a method as defined in the first paragraph is characterised in that said estimate is calculated taking into account a prevailing condition. Said prevailing condition may be, for example, the current bit error rate in the received code words, the current probabilities of each individual bit of the received code words being in error, and/or recent history, i.e. the previously generated value $v_j(t-1)$. It has been found that calculating said conditional probability in this way enables the errors resulting from the known method to be reduced.

BRIEF DESCRIPTION OF THE DRAWING

Embodiments of the present invention will now be described, by way of example, with reference to the accompanying drawings, wherein.

DETAILED DESCRIPTION OF THE PREFERRED EMBODIMENT

Figure 1:
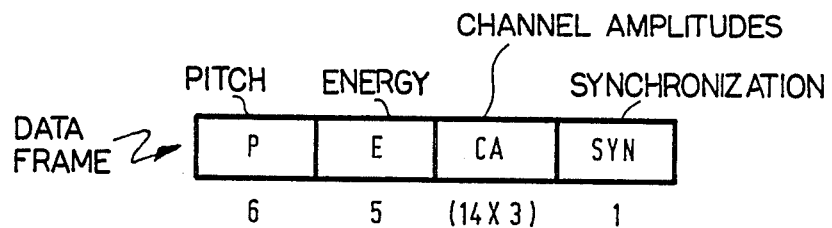
FIG. 1 illustrates a data frame which may be used in the transmission of channel vocoded data.

In FIG. 1, the data frame contains various quantised parameters namely pitch P (6 bits), energy E (5 bits), channel amplitudes CA (14 channels in which amplitudes are represented by 3 bits, equivalent to 8 levels) and synchronisation, SN (1 bit). If transmitted at 2400 bps then the 54 bit data frame represents 22.5 ms of speech.

Over some transmission channels error rates of between 1% and 10% are not unusual. In the case of speech digitised using conventional vocoders a 1% error rate produces a noticeable slurring of the speech and an error rate of greater than 5% renders the reproduced speech unintelligible. The effects of signalling errors can be reduced by a method in accordance with the present invention wherein the decoding decisions take into account the conditional probabilities that particular code words were transmitted, a particular code word having been received, which probabilities are calculated taking into account a prevailing condition such as the current bit error rate in the received code words, the current probabilities of each individual bit being in error (soft decision information), one or more previous decoding decisions and/or the statistical properties of the transmitted signal. Encoding speech using minimum rms coding assists in reducing the effects of signalling errors.

Figure 2:
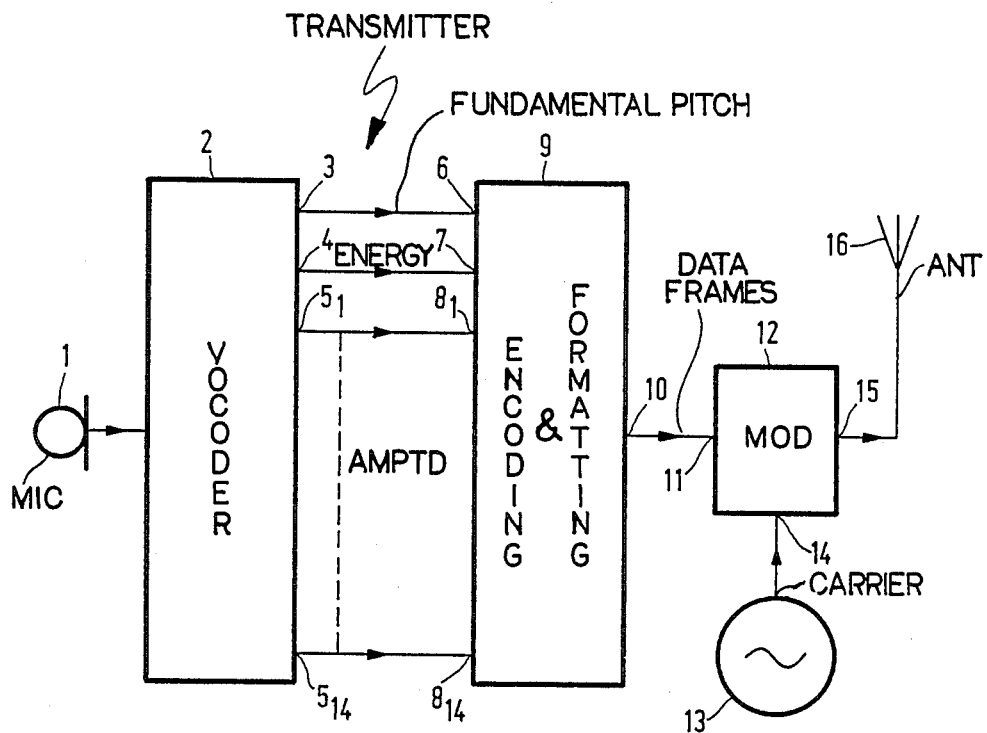
FIG. 2 is a block schematic diagram of a transmitter.

FIG. 2 is a block diagram of a transmitter for transmitting data representative of successive values of an analogue signal, in the present case successive values of a plurality of analogue signals representing various properties of a speech signal from a microphone 1. This speech signal is first analysed in a vocoder 2, in the present case a conventional channel vocoder, which converts it into digital form and produces digital words representative of successive values of the fundamental pitch of the speech on an output 3, digital words representative of successive values of the energy of the speech on an output 4, and digital words representative of successive values of the amplitude of the speech in each of fourteen frequency ranges on respective outputs $5_1 \ldots 5_{14}$. These outputs are coupled to inputs 6,7 and $8_1 \ldots 8_{14}$ respectively of an encoding and formatting device 9 which produces a succession of data frames each as described with reference to FIG. 1 on an output 10. Output 10 is coupled to the modulation signal input 11 of a modulator 12, for example a Binary Phase Shift Keying modulator, in which the data frames are modulated on a carrier signal applied to a further input 14 by a carrier signal generator 13. The resulting modulated carrier appears, after amplification, on an output 15 whence it is applied to an aerial 16 and transmitted over a radio channel.

Device 9 encodes the successive digital words applied to at least one of its sixteen inputs into binary code words containing redundancy, before inserting the results into the respective data frames. For the purpose of the present description the encoding of the vocoder output words on just one of these inputs, viz input 7, will be described. These output words, representative of successive values $u_j(t)$ of the speech energy (the variation of which energy with time effectively itself constitutes an analogue signal) in the present case each consist of four bits and each is encoded as a corresponding five-bit word $x_j(t)$ in device 9. This may be done by means of a ROM look-up table which therefore performs the operations $x_j(t) = F(u_j(t))$. The particular conversions effected may be as shown in the following Table.

TABLE

| $u_j$ (decimal, quantized) | Vocoder output word | Output word $x_j$ of device 9 |
|---|---|---|
| 0 | 0000 | 00010 |
| 1 | 0001 | 00011 |
| 2 | 0010 | 00000 |
| 3 | 0011 | 00001 |
| 4 | 0100 | 10000 |
| 5 | 0101 | 00100 |
| 6 | 0110 | 01000 |
| 7 | 0111 | 01001 |
| 8 | 1000 | 11000 |
| 9 | 1001 | 01100 |
| 10 | 1010 | 11001 |
| 11 | 1011 | 01101 |
| 12 | 1100 | 11100 |
| 13 | 1101 | 11101 |
| 14 | 1110 | 11110 |
| 15 | 1111 | 11111 |

Figure 3:
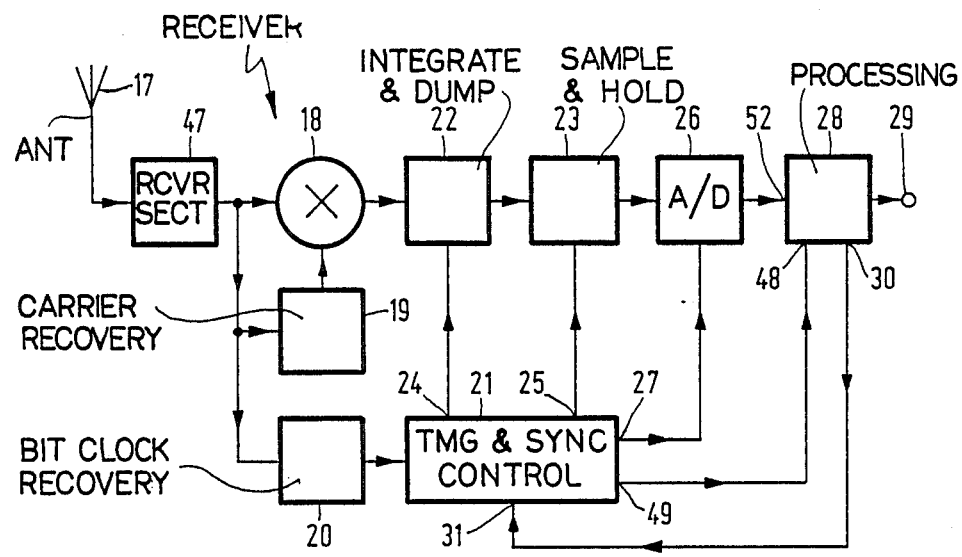
FIG. 3 is a block schematic diagram of a receiver.

FIG. 3 is a block diagram of a receiver for the modulated carrier signal transmitted over a broadcast channel by the transmitter of FIG. 2. The carrier, after pick-up by an aerial 17, is applied to a mixer 18, a carrier recovery circuit 19 and a bit clock recovery circuit 20 via a receiver section 47 which inter alia translates it to a lower frequency. Carrier recovery circuit 19 extracts the translated carrier frequency and phase in known manner from the received signal and applies it as a reference signal to the second input of mixer 18. Bit clock recovery circuit 20 extracts the bit clock frequency and phase from the translated received signal in known manner and applies it to a timing and synchronisation control circuit 21. The circuit 21 in response generates control signals for an integrate-and-dump circuit 22 and a sample-and-hold circuit 23 on outputs 24 and 25 respectively.

The output signal of mixer 18 (which effectively acts as a demodulator for the received signal) is applied to the integrate-and-dump circuit 22 which, under the control of the control signal from circuit 21, integrates it over each of the successive bit periods and dumps the result at the end of each bit period. The result of this is applied to the sample-and-hold circuit 23 which is controlled by circuit 21 to sample-and-hold the output signal of circuit 22 just before each resetting of this output signal. The output signal of circuit 23 is applied to an analogue-to-digital converter 26 which is controlled by a signal on a further output 27 of circuit 21 to convert each value held by circuit 23 to digital form and apply this to an intput 52 of a processing arrangement 28 which is also controlled by a control signal applied to an input 48 thereof from an output 49 of circuit 21. The output signal of arrangement 28 appears on an output terminal 29 which may be connected to the input of a vocoder synthesiser (not shown). A further output 30 of arrangement 28 is coupled to a further input 31 of circuit 21 for applying the synchronisation bit of each data frame (FIG. 1) to circuit 21 to enable circuit 21 to maintain frame as well as bit synchronisation. (Circuit 21 may be arranged, for example, to monitor a data pattern imposed on the succession of synchronisation bits over a period of time and respond by making timing adjustments as necessary to remain synchronised).

Figure 4:
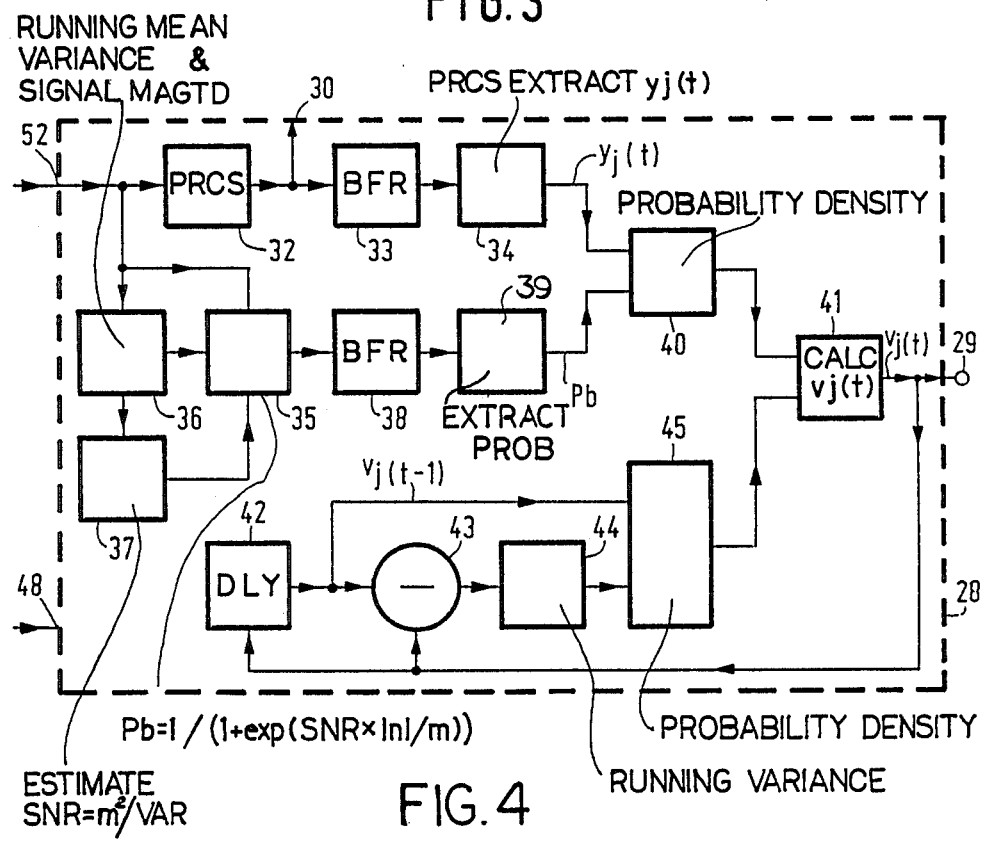
FIG. 4 shows the operations performed by one of the blocks of FIG. 3.

FIG. 4 is a diagram showing the mode of operation of the processing arrangement 28 of FIG. 3 (which may in practice be constituted by a suitably programmed microcomputer) in particular in respect of the processing of the code words $y_j(t)$ received in response to the transmission of the code words $x_j(t)$. The output signals of the A/D converter 26 (one bit per period) are compared with a reference, in the present case zero, in process block 32, resulting in a binary "1" if the relevant signal is greater than zero and a binary "0" if it is less than zero (or vice versa depending on the actual modulation characteristic employed). Thus a hard decision is made on whether each received bit is "1" or "0". The results of these decisions are applied to the timing and control circuit 21 of FIG. 3 via output 30 and are also clocked into a storage buffer 33 such as a shift register. Each received code word $y_j(t)$ is extracted from its thus stored received data frame in a process block 34. The reliability of each individual received bit is also assessed in a process block 35. To this end a running mean m and a running variance VAR, running for example over 10-100 bit periods, of the magnitudes of the successive output signals n of the A/D converter 26 are calculated in a process block 36, the broadcast channel current signal-to-noise ratio (SNR) is estimated from these in a process block 37 according to the formula $SNR = m^2/VAR$, and the probability $p_b$ of each individual bit being in error is calculated from SNR, m and the magnitude of the corresponding output signal n of A/D converter 26 in process step 35 according to the formula $p_b = 1/(1 + \exp(SNR \times |n|/m))$ and clocked into a storage buffer 38. Thus for each bit stored in buffer 33 there is a quantity stored in buffer 38 indicative of the probability that that bit is in error. When each word $y_j(t)$ is extracted from buffer 33 in function block 34 the probabilities $p_b$ of errors in the respective bits thereof are extracted from buffer 38 in a process step 39. These words and probabilities are then utilised in a process step 40 to calculate a probability density function corresponding to and conditional on each word $y_j(t)$. More particularly, for each word $x_i$ which could have been transmitted, i.e. which is contained in the Table under the heading "output word x of device 9", a quantity $p(y_j(t)|x_i)$ is calculated, where $p(y_j(t)|x_i)$ is equal to $$\prod_{k=1}^{q} G_{ij}(a_{ik}, b_{jk}),$$

$a_{ik}$ being the kth bit of $x_i$, $b_{jk}$ being the kth bit of $y_j(t)$, $G_{ij}(a_{ik}, b_{jk})$ being equal to $1 - p_b(k)$ if $a_{ik} = b_{jk}$ and being equal to $p_b(k)$ if $a_{ik}$ is not equal to $b_{jk}$, $p_b(k)$ being the probability that the kth bit of $y_j(t)$ is in error, and q being the number of bits in a code word (=5 in the present case). In fact in general a quantity $p(y_j(t)|x_i)p(x_i)$ is calculated for each 5-bit word, where $p(x_i)$ is the probability that 5-bit word $x_i$ was transmitted, it being assumed in the present case that all $x_i$ which are included in the Table under the heading "Output word $x_j$ of device 9" have equal probabilities of being transmitted, the probability $p(x_i)$ of each code word which is not included under this heading being transmitted being of course equal to zero. In some circumstances, e.g. because of particular statistical properties of the signal on input 7 in FIG. 2, the probabilities of the various $x_i$ which are included in the Table being transmitted will not be equal, in which case this will have to be taken into account when performing the calculations in process block 40.

The results of the calculations performed in process block 40 for each word $y_j(t)$ are now used in a process block 41 to estimate what the corresponding value $u_j(t)$ of the signal on input 7 in FIG. 2 was. More particularly each such estimate, which will be denoted as $v_j(t)$, is calculated from the expression $$v_j(t) \approx \frac{\sum_{i=1}^{n} p(x_i|y_j(t))F^{-1}(x_i)}{\sum_{i=1}^{n} p(x_i|y_j(t))}$$

where each $p(x_i|y_j(t))$, a measure of the probability that $x_i$ was transmitted, $y_j(t)$ having been received, is made proportional to the corresponding value $p(y_j(t)|x_i)p(x_i)$ calculated in process step 40 and $F^{-1}$ denotes the inverse of the mapping function from the first two columns of the Table to the third column thereof. As an example, if it is assumed that each $p_b$ is small, for example 0.05, that the remainder of the process blocks shown in FIG. 4 are omitted (as they may be) and that a received code word $y_j(t)$ is equal to 00101 (which is not included in the third column of the Table) then the only $p(y_j(t)|x_i)p(x_i)$ calculated in process step 40 which will have significant magnitudes are those corresponding to the three 5-bit words 01101, 00001 and 00100, one bit being in error in each case and the other 5-bit words in which one bit is in error, viz 10101 and 00111, not being included in the Table. From the Table the said three 5-bit words correspond to decimal 11, 3 and 5 respectively so the calculation performed in step 41 will take the form $v_j \approx (0.05 \times 11 + 0.05 \times 3 + 0.05 \times 5)/(0.05 + 0.05 + 0.05)$ i.e. $v_j(t) \approx 6$.

As so far described the probability $p_b$ of each individual bit of $y_j(t)$ being in error is separately calculated by means of the blocks 35-39 of FIG. 4. As an alternative these blocks may be replaced by process steps in which the current overall probability $p_e$ of a bit error is estimated. This may be done, for example, by examining each word $y_j(t)$ to determine whether or not it forms part of the coding Table. If it does not then obviously at least one bit error has occurred whereas if it does it is likely, at least for comparatively small bit error rates, that no bit errors have occurred. In this case the calculation of each $p(y_j(t)|x_i)$ in block 40 from $$p(y_j(t)|x_i) = \prod_{k=1}^{q} G_{ij}(a_{ik}, b_{jk})$$

is replaced by a calculation of each $p(y_j(t)|x_i)$ from $p(y_j(t)|x_i) = p_e^d(1-p_e)^{q-d}$ where $P_e$ is the current overall probability of a bit error, d the Hamming distance between $y_j(t)$ and $x_i$, and q the number of bits in a code word.

In addition to the process indicated by the blocks 32-40 of FIG. 4 the arrangement 28 of FIG. 3 may be arranged to perform a process indicated by the blocks 42-45 of FIG. 4. If provision is made for the latter process the estimates $v_j(t)$ produced by process block 41, and these estimates $v_j(t-1)$ delayed by one data frame period in a process step 42, are subtracted one from the other in a process step 43. Thus the results of process step 43 are the differences between successive estimates $v_j(t)$. The running variance (sigma)$^2$ of these differences, i.e. a running sum of their squares, is then calculated in a process step 44 and this variance (sigma)$^2$ and the delayed estimates $v_j(t-1)$ are then utilised in a process step 45 to calculate a further probability density function corresponding to and conditional on each delayed estimate $v_j(t-1)$. This function is used in the step 41 to modify each estimate $v_j(t)$ which would otherwise be produced so that the modified estimate takes into account what the previous estimate $v_j(t-1)$ was, i.e. what the difference between the current estimate and the previous estimate is likely to be. Many different assumptions can be made about the probabilities of different differences occurring; in the present case it is assumed that these probabilities form a Gaussian distribution around the previous estimate $v_j(t-1)$. Thus in process step 45, for each received code word $y(t)$ produced by process step 34 a quantity $p(x_i|v_j(t-1)) = \exp[-(v_j(t-1)-F^{-1}(x_i))^2/2(\text{sigma})^2]$ is calculated for each code word $x_i$ which could have been transmitted, this quantity being proportional to the conditional probability that code word $x_i$ was transmitted, a value $v_j(t-1)$ having been estimated to correspond to the code word received previously. These quantities $p(x_i|v_j(t-1))$ are now used in the process step 41 to modify the corresponding values $p(x_i|y_j(t))$ so that each $p|y_j)$ is now also made proportional to the corresponding $p(x_i|v_j(t-1))$ by multiplication. Taking the example described previously in which a code word $y_j(t) = 00101$ is received, and assuming for example that the immediately preceding estimate $v_j(t-1)$ was decimal 10, the coefficient of decimal 5 in the calculation for $v_j(t)$ will be reduced relative to that of decimal 11, and the coefficient of decimal 3 will be reduced even further (each being multiplied by the corresponding $p(x_i|v_j(t-1))$, so that the result of the calculation will lie somewhere between decimal 6 and decimal 11, its exact position depending on the current value of the variance determined in step 44.

If the arrangement 28 is arranged to perform the process steps indicated by blocks 42-45 in FIG. 4 those indicated by blocks 35-39, or their alternative mentioned previously, may be omitted, it then being assumed for the purpose of process block 40 that the probability of a bit error is constant at a specific value.

It will be evident that the radio channel from the transmitter of FIG. 2 to the receiver of FIG. 3 may be replaced by some other form of transmission channel, for example an infra-red transmission channel in an optical fibre.

I claim:

1. A method of decoding a succession of binary code word signals $y_j(t)$ comprising the steps of:
   (a) receiving the code word signals $y_j(t)$ from a transmission channel, which code word signals result from transmission over the channel of successive binary code word signals $x_j(t)$ representative of respective successive values $u_j(t)$ of an analogue signal, where $x_j(t)=F(u_j(t))$; and (b) generating successive values $v_j(t)$ by estimating from the successive received code word signals $y_j(t)$ to correspond to the successive values $u_j(t)$, the estimation process taking the form $$v_j(t) \simeq \frac{\sum_{i=1}^{n} p(x_i|y_j(t))F^{-1}(x_i)}{\sum_{i=1}^{n} p(x_i|y_j(t))}$$

where $F^{-1}$ denotes the inverse of mapping function F, n is an integer, and each $p(x_i|y_j(t))$ is an estimate of the relative conditional probability that $x_i$ was transmitted, $y_j(t)$ having been received, (c) providing $v_j(t)$ as output signals; wherein the improvement comprises that said estimate is calculated taking into account a prevailing condition.

2. A method as claimed in claim 1, comprising producing each $p(x_i|y_j(t))$ signal taking into account the current bit error rate in the received code word signals.

3. A method as claimed in claim 2, comprising the step of producing each $p(x_i|y_j(t))$ signal to have a value proportional to $p(y_j(t)|x_i)p(x_i)$, where $p(x_i)$ is the probability that the binary code word signal $x_i$ was transmitted, and $p(y_j(t)|x_i)=p_e^d(1-p_e)^{q-d}$, $p_e$ being the probability of a bit error, d the Hamming distance between $y_j(t)$ and $x_i$, and q the number of bits in a code word.

4. A method as claimed in claim 1, comprising the step of producing each $p(x_i|y_j(t))$ signal taking into account the current probabilities of each individual bit of the received code word signals being in error.

5. A method as claimed in claim 4, comprising the step of producing each $p(x_i|y_j(t))$ signal to be proportional to $p(y_j(t)|x_i)p(x_i)$ where $p(x_i)$ is the probability that $x_i$ was transmitted, and the $$p(y_j(t)|x_i) = \prod_{k=1}^{q} G_{ij}(a_{ik}, b_{jk}),$$

$a_{ik}$ being kth bit of $x_i$, $b_{jk}$ being the kth bit of $y_j(t)$, $G_{ij}(a_{ik},b_{jk})$ being equal to $1-p_b(k)$ if $a_{ik}=b_{jk}$ and being equal to $p_b(k)$ if $a_{ik}$ is not equal to $b_{jk}$, $p_b(k)$ being the probability that the kth bit of $y_j(t)$ is in error, and q being the number of bits in a code word signal.

6. A method as claimed in claim 1, 2, 3, 4, or 5, comprising the step of producing the $p(x_i|y_j(t))$ signal taking into account the previously generated signal value $j_j(t-1)$.

7. A method as claimed in claim 6, wherein each $p(x_i|y_j(t))$ signal is given a value proportional to $\exp[(v_j(t-1)-F^{-1}(x_i))^2/2(\text{Sigma})^2]$ where $(\text{sigma})^2$ is the current variance of the successive generated signal values v.

8. A method for decoding a succession of binary code word signals comprising the steps of:

a. receiving from a transmission channel a succession of received binary code word signals, which received binary code word signals result from a succession of transmitted binary code word signals, said succession of transmitted binary code word signals representing the result of applying a mapping function to respective successive values of an analogue signal to be transmitted;

b. generating a succession of respective estimated values of the successive values of the analogue signal, said estimated values being a quotient of first and second sums, said first and second sums both being calculated over a number of possible transmitted binary code word signals, and corresponding to a present received code word signal, said first sum being of products resulting from multiplying an estimate of a conditional probability, of one of the possible transmitted binary code word signals given the present received code word signal, by an inverse of the mapping function applied to the one possible transmitted code word signal, said second sum being of the estimates of the conditional probability; and c. providing the estimated values as output signals; wherein the improvement comprises:

d. taking into account a prevailing condition during said generating step.

9. The method of claim 8 wherein the taking step comprises using a current bit error rate in the succession of received code word signals to determine the conditional probability.

10. A method for digitally communicating data representative of successive values of an analogue signal comprising the steps of:

a. first generating successive binary code word signals representative of respective ones of said successive values using a mapping function;

b. transmitting the successive binary code word signals over a transmission channel;

c. receiving respective versions of the successive binary code word signals from the transmission channel;

d. second generating a succession of estimated values of the respective successive values of the analogue signal, said estimated values representing a quotient of first and second sums, said first and second sums both being calculated over a number of possible ones of said binary code word signals, and corresponding to a present received code word signal, said first sum being of products, each of said products resulting from multiplying an estimate of a conditional probability, of one of the possible transmitted binary code word signals given the present received code word signal, by a value of an inverse of the mapping function applied to the one possible transmitted code word signal, said second sum being of the estimates of the conditional probability; and e. providing the estimated values as output signals; wherein the improvement comprises:

f. taking into account a prevailing condition during said second generating step.

* * * * *